United States Patent
Wang

(10) Patent No.: US 9,614,036 B2
(45) Date of Patent: Apr. 4, 2017

(54) MANUFACTURE METHOD OF TFT SUBSTRATE AND STURCTURE THEREOF

(71) Applicant: Shenzhen China Star Optoelectronics Technology Co., Ltd., Shenzhen, Guangdong (CN)

(72) Inventor: Jun Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 245 days.

(21) Appl. No.: 14/427,633

(22) PCT Filed: Sep. 11, 2014

(86) PCT No.: PCT/CN2014/086259
§ 371 (c)(1),
(2) Date: Mar. 11, 2015

(87) PCT Pub. No.: WO2016/026178
PCT Pub. Date: Feb. 25, 2016

(65) Prior Publication Data
US 2016/0056267 A1  Feb. 25, 2016

(30) Foreign Application Priority Data
Aug. 20, 2014 (CN) .......................... 2014 1 0415838

(51) Int. Cl.
*H01L 29/06* (2006.01)
*H01L 29/786* (2006.01)
(Continued)

(52) U.S. Cl.
CPC .......... *H01L 29/0657* (2013.01); *H01L 29/24* (2013.01); *H01L 29/66969* (2013.01); *H01L 29/7869* (2013.01); *H01L 29/78618* (2013.01)

(58) Field of Classification Search
CPC ................ H01L 29/0657; H01L 29/24; H01L 29/66969; H01L 29/78618
See application file for complete search history.

(56) References Cited

U.S. PATENT DOCUMENTS 8,283,671 B2 * 10/2012 Kim ................ H01L 29/66765
257/59
8,334,528 B2 * 12/2012 Kuzumoto ............ H01L 51/105
257/40

FOREIGN PATENT DOCUMENTS

| CN | 103887343 A | 6/2014 |
| CN | 103915508 A | 7/2014 |

* cited by examiner

*Primary Examiner* — Errol Fernandes
(74) *Attorney, Agent, or Firm* — Andrew C. Cheng

(57) ABSTRACT

The present invention provides a manufacture method of an oxide semiconductor TFT substrate, and the method comprises steps of: 1, forming a gate (2) on a substrate (1); 2, deposing a gate isolation layer (3); 3, forming an island shaped oxide semiconductor layer (4); 4, forming an island shaped photoresistor layer (6) and an island shaped etching stopper layer (5), and the island shaped etching stopper layer (5) covers a central part (41) of the island shaped oxide semiconductor layer (4) and exposes two side parts (43) of the island shaped oxide semiconductor layer (4); 5, implementing ion implantation process to the two side parts (43) of the island shaped oxide semiconductor layer (4); 6, lifting off the island shaped photoresistor layer (6); 7, forming a source/a drain (7), and the source/the drain (7) contact the two side parts (43) of the island shaped oxide semiconductor layer (4) to establish electrical connections; 8, deposing and patterning a protecting layer (8); 9, deposing and patterning a pixel electrode layer (9); 10, implementing anneal process.

11 Claims, 4 Drawing Sheets

(51) Int. Cl.
*H01L 29/24* (2006.01)
*H01L 29/66* (2006.01)

MANUFACTURE METHOD OF TFT SUBSTRATE AND STURCTURE THEREOF

FIELD OF THE INVENTION

The present invention relates to a display technology field, and more particularly to a manufacture method of an oxide semiconductor TFT substrate and a structure thereof.

BACKGROUND OF THE INVENTION

A flat panel display possesses advantages of being ultra thin, power saved and radiation free and has been widely utilized. Present flat panel displays mainly comprise a LCD (Liquid Crystal Display) or an OLED (Organic Light Emitting Display).

To be compared with a well developed TFT-LCD, an OLED based on the Organic Light Emitting Diodes is an active light emitting display, which possesses outstanding properties of self-illumination, high contrast, wide view angle (up to 170°), fast response, high luminous efficiency, low operation voltage (3-10V), ultra-thin (thickness smaller than 2 mm) and etc. The display devices utilizing OLED technology has possibility to have a lighter, thinner, charming appearance, more excellent color display quality, wider view range and greater design flexibility.

Thin Film transistors (TFT) are important components of a flat panel display which can be formed on a glass substrate or a plastic substrate. Generally, the tin film transistors are employed as light switching-on elements and driving elements utilized such as LCDs, OLEDs, Electrophoresis Displays (EPD).

The oxide semiconductor TFT technology is the most popular skill at present. Because the carrier mobility of the oxide semiconductor is 20-30 times of the amorphous silicon semiconductor. With the higher electron mobility, it is capable of magnificently raising the charging/discharging rate of TFT to the pixel electrodes to promote the response speed of the pixels and to realize faster refreshing rate. In the mean time, the line scan rate of the pixels also can be promoted to make the manufacture of the flat panel display having ultra high resolution become possible. In comparison with the Low Temperature Poly-silicon (LTPS), the oxide semiconductor manufacture process is simpler and possesses higher compatibility with the amorphous silicon process. It can be applicable to the skill fields of Liquid Crystal Display, Organic Light Emitting Display, Flexible Display and etc. Because it fits the new generation production lines and has possible applications for displays with Large, Middle and Small sizes. The oxide semiconductor has the great opportunity of application development.

In a present oxide semiconductor TFT substrate structure, the oxide semiconductor layer generally contacts the source/the drain directly without treatment in general and form electrical connections therebetween. However, the ohm contact resistance inbetween is larger and leads to higher driving voltage and higher power consumption of the flat panel display.

The power saving is real a required topic to the development of the present society. Making great efforts to develop low power consumption flat panel display becomes an important target to all flat panel display manufacturers.

SUMMARY OF THE INVENTION

An objective of the present invention is to provide a manufacture method of an oxide semiconductor TFT substrate capable of improving the ohm contact between the oxide semiconductor layer and the source/the drain to reduce the ohm contact resistance therebetween. The driving voltage of the flat panel display can be reduced and accordingly the power consumption of the flat panel display can be effectively diminished.

Another objective of the present invention is to provide an oxide semiconductor TFT substrate structure, which the ohm contact resistance between the oxide semiconductor layer and the source/the drain is smaller to reduce the driving voltage of the flat panel display and to diminish the power consumption of the flat panel display.

For realizing the aforesaid objective, the present invention provides a manufacture method of an oxide semiconductor TFT substrate, comprising steps of:

step 1, providing a substrate, and deposing and patterning a first metal layer on the substrate to form a gate;

step 2, deposing a gate isolation layer on the gate and the substrate; step 3, deposing and patterning an oxide semiconductor layer on the gate isolation layer to form an island shaped oxide semiconductor layer directly over the gate;

step 4, sequentially deposing an etching stopper layer, a photoresistor layer on the island shaped oxide semiconductor layer and the gate isolation layer, and then implementing photolithography process to the photoresistor layer to form an island shaped photoresistor layer directly over the island shaped oxide semiconductor layer, and etching the etching stopper layer to form an island shaped etching stopper layer on the island shaped oxide semiconductor layer;

a width of the island shaped etching stopper layer is smaller than a width of the oxide semiconductor layer; the island shaped etching stopper layer covers a central part of the island shaped oxide semiconductor layer and exposes two side parts of the island shaped oxide semiconductor layer;

step 5, implementing ion implantation process to the two side parts of the island shaped oxide semiconductor layer;

step 6, lifting off the island shaped photoresistor layer from the island shaped etching stopper layer;

step 7, deposing and patterning a second metal layer on the island shaped etching stopper layer and the gate isolation layer to form a source/a drain;

the source/the drain contact the two side parts of the island shaped oxide semiconductor layer to establish electrical connections;

step 8, deposing and patterning a protecting layer on the source/the drain and the etching stopper layer to form a via located at one side of the island shaped oxide semiconductor layer;

step 9, deposing and patterning a pixel electrode layer on the protecting layer;

the pixel electrode layer fills the via and contacts the source/the drain to establish electrical connections;

step 10, implementing anneal process to the substrate obtained in the ninth step.

Operations of the patterning are accomplished by photolithography process and etching process.

The island shaped oxide semiconductor layer is an IGZO semiconductor layer.

The ion implantation process is implemented with hydrogen plasma.

Material of the pixel electrode layer is ITO or IZO.

Material of the protecting layer is $SiO_2$ or SiON.

The substrate is a glass substrate.

The present invention further provides an oxide semiconductor TFT substrate structure, comprising a substrate, a gate on the substrate, a gate isolation layer on the gate and the substrate, an island shaped oxide semiconductor layer directly over the gate on the gate isolation layer, an island shaped etching stopper layer on the island shaped oxide semiconductor layer, a source/a drain on the island shaped etching stopper layer and the gate isolation layer, a protecting layer on the source/the drain and the etching stopper layer and a pixel electrode layer on the protecting layer; the island shaped oxide semiconductor layer comprises a central part and two side parts, and the two side parts are implemented with ion implantation process, a width of the island shaped etching stopper layer is smaller than a width of the oxide semiconductor layer and only a central part is covered; the source/the drain contact the two side parts to establish electrical connections; the protecting layer comprises a via located at one side of the island shaped oxide semiconductor layer, and the pixel electrode layer fills the via and contacts the source/the drain to establish electrical connections.

The island shaped oxide semiconductor layer is an IGZO semiconductor layer, and material of the pixel electrode layer is ITO or IZO and material of the protecting layer is $SiO_2$ or SiON.

The substrate is a glass substrate.

The benefits of the present invention are: according to the manufacture method of the oxide semiconductor TFT structure of the present invention, by implementing ion implantation process to the two side parts of the island shaped oxide semiconductor layer, the conducting ability of the two side parts are raised and the two side parts contact the source/the drain, which are capable of promoting the ohm contact between the oxide semiconductor layer and the source/the drain to reduce the ohm contact resistance therebetween. The driving voltage of the flat panel display can be reduced and accordingly the power consumption of the flat panel display can be effectively diminished; according to the oxide semiconductor TFT structure of the present invention, by implementing ion implantation process to the two side parts of the island shaped oxide semiconductor layer and contacts with the source/the drain, the ohm contact resistance between the oxide semiconductor layer and the source/the drain is smaller to reduce the driving voltage of the flat panel display and to diminish the power consumption of the flat panel display.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

In order to better understand the characteristics and technical aspect of the invention, please refer to the following detailed description of the present invention is concerned with the diagrams.

Figure 1:
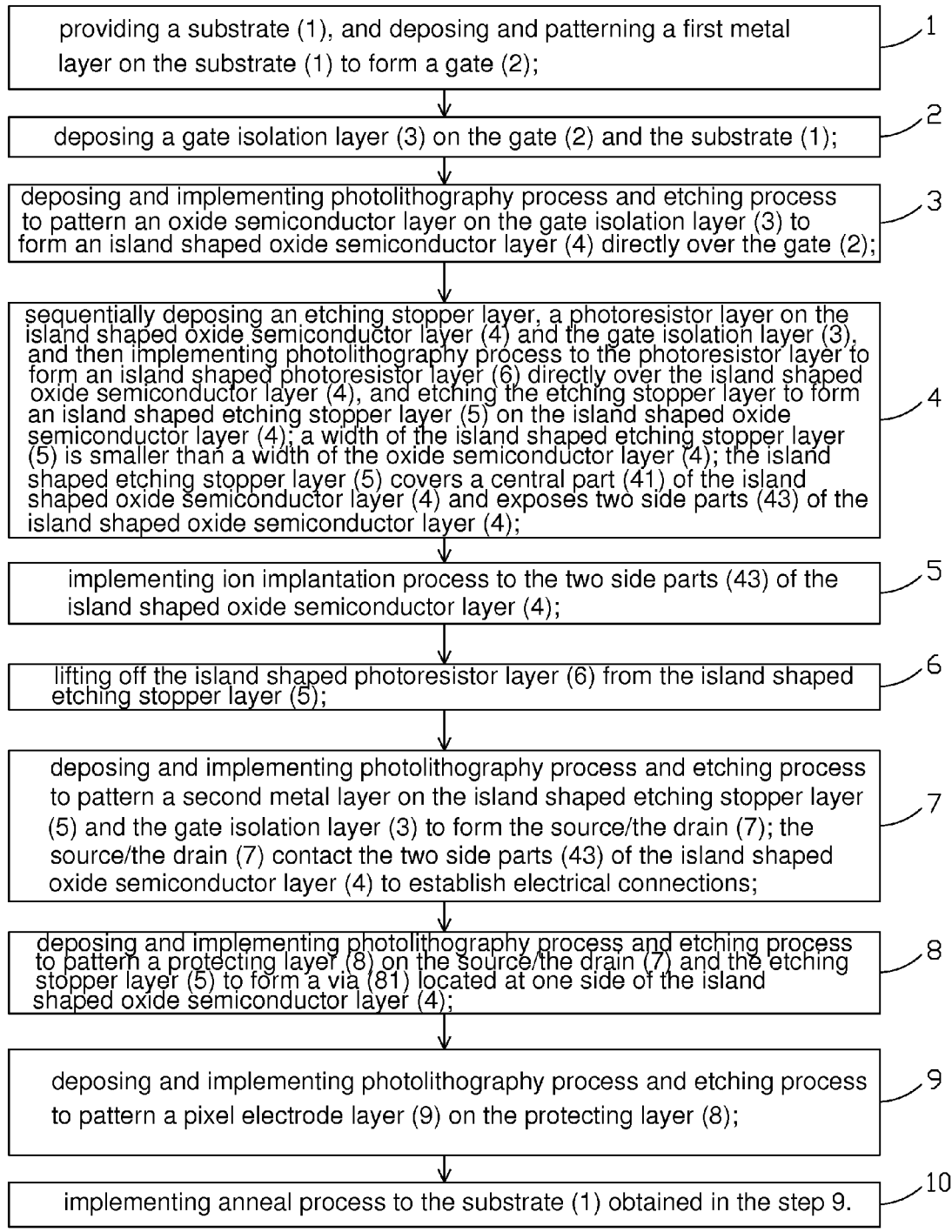
FIG. 1 is a flowchart of a manufacture method of an oxide semiconductor TFT substrate according to the present invention.
Figure 2:
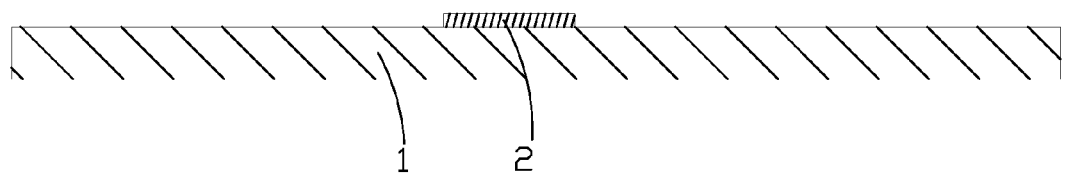
FIG. 2 is a diagram of step 1 in the manufacture method of the oxide semiconductor TFT substrate according to the present invention.

Please refer to FIG. 1, which is a flowchart of a manufacture method of an oxide semiconductor TFT substrate according to the present invention, comprising steps of:

step 1, please refer to FIG. 2, providing a substrate 1, and deposing and patterning a first metal layer 2 on the substrate 1.

The substrate 1 is a transparent substrate. Preferably, the substrate 1 is a glass substrate.

Figure 3:
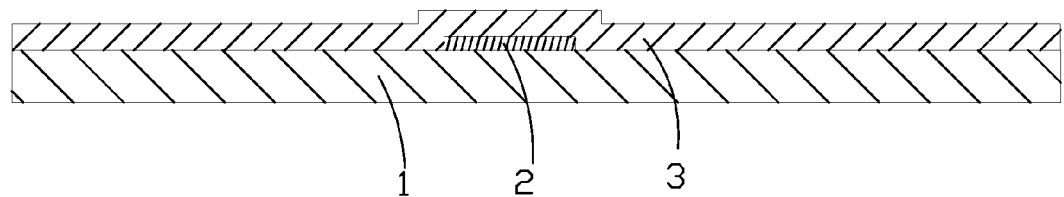
FIG. 3 is a diagram of step 2 in the manufacture method of the oxide semiconductor TFT substrate according to the present invention.

In the step 1, the photolithography process is implemented with one general mask, and then the etching process is implemented to pattern the first metal layer to form a gate 2.

step 2, please refer to FIG. 3, deposing a gate isolation layer 3 on the gate 2 and the substrate 1.

Figure 4:
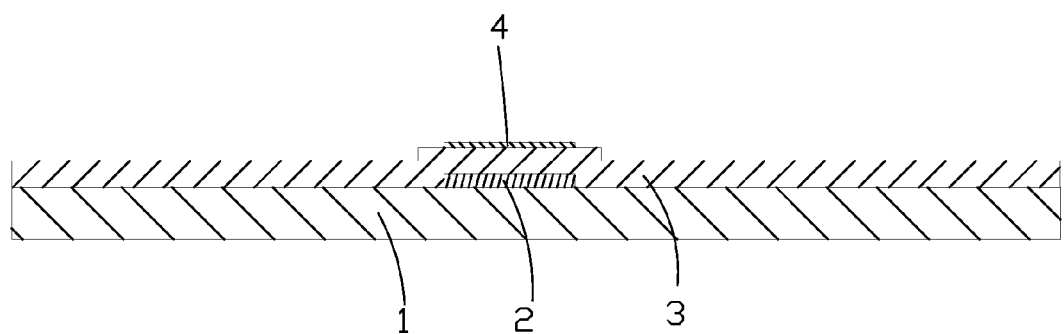
FIG. 4 is a diagram of step 3 in the manufacture method of the oxide semiconductor TFT substrate according to the present invention.

The gate isolation layer 3 covers the entire gate 2 and substrate 1.

step 3, please refer to FIG. 4, deposing and implementing photolithography process and etching process to pattern an oxide semiconductor layer on the gate isolation layer 3 to form an island shaped oxide semiconductor layer 4 directly over the gate 2.

Figure 5:
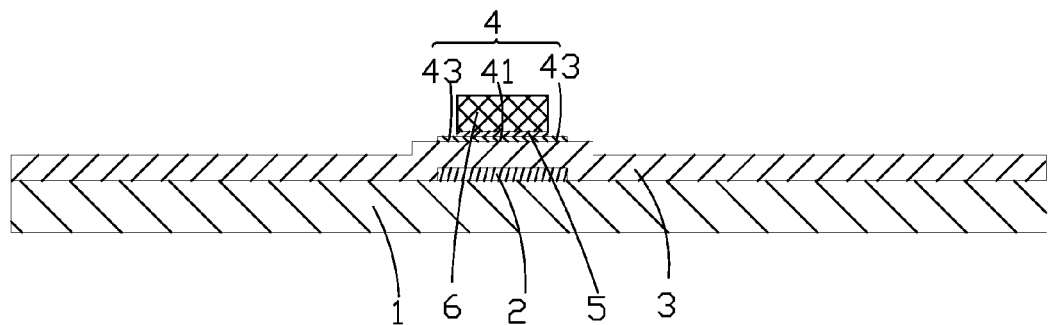
FIG. 5 is a diagram of step 4 in the manufacture method of the oxide semiconductor TFT substrate according to the present invention.

Specifically, the island shaped oxide semiconductor layer 4 is an Indium gallium zinc oxide (IGZO) semiconductor layer.

step 4, please refer to FIG. 5, sequentially deposing an etching stopper layer, a photoresistor layer on the island shaped oxide semiconductor layer 4 and the gate isolation layer 3, and then implementing photolithography process to the photoresistor layer to form an island shaped photoresistor layer 6 directly over the island shaped oxide semiconductor layer 4, and etching the etching stopper layer to form an island shaped etching stopper layer 5 on the island shaped oxide semiconductor layer 4.

Furthermore, a width of the island shaped etching stopper layer 5 is smaller than a width of the oxide semiconductor layer 4; the island shaped etching stopper layer 5 covers a central part 41 of the island shaped oxide semiconductor layer 4 and exposes two side parts 43 of the island shaped oxide semiconductor layer 4.

step 5, implementing ion implantation process to the two side parts 43 of the island shaped oxide semiconductor layer 4.

Specifically, to the IGZO semiconductor layer, the ion implantation process is implemented with hydrogen plasma (H2 plasma). After the hydrogen plasma process, huge amount of H2 ions are implanted into the two side parts 43 of the island shaped oxide semiconductor layer 4 to reduce the energy gap of the two side parts 43 and raising the conducting ability thereof. Accordingly, the ohm contact resistance between the island shaped oxide semiconductor layer 4 and a source/a drain 7 formed in the following step 7.

Figure 6:
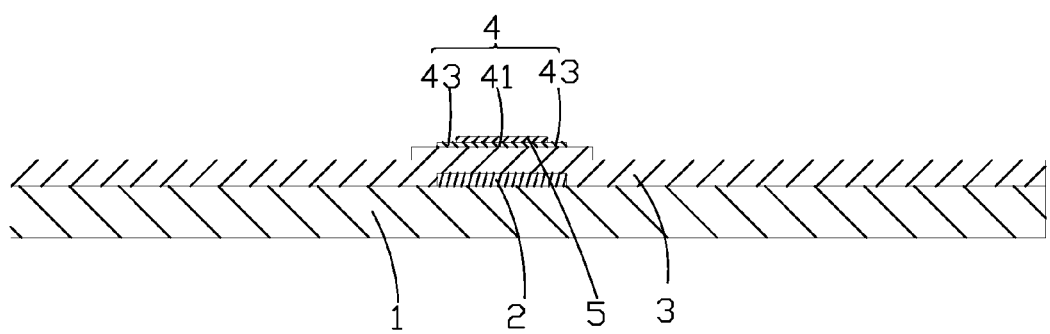
FIG. 6 is a diagram of step 6 in the manufacture method of the oxide semiconductor TFT substrate according to the present invention.
Figure 7:
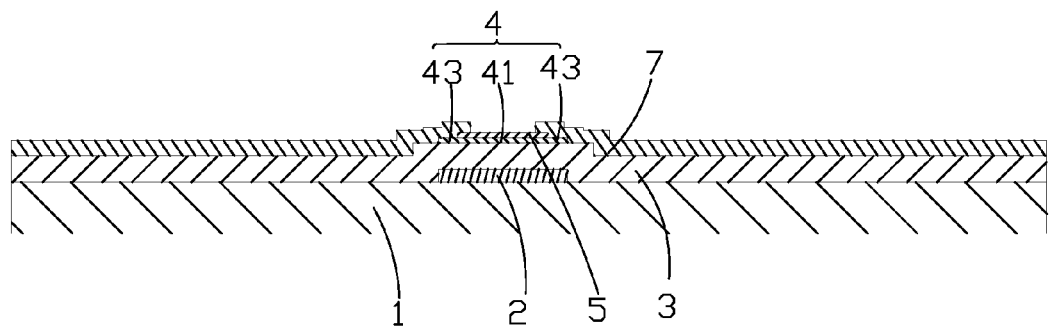
FIG. 7 is a diagram of step 7 in the manufacture method of the oxide semiconductor TFT substrate according to the present invention.

Certainly, to the non IGZO semiconductor layer, specific ions can be selected and implanted according to the specific material of the oxide semiconductor layer to realize the object of implantation to reduce the ohm contact resistance between the island shaped oxide semiconductor layer 4 and a source/a drain 7 formed in the following step 7.

step 6, please refer to FIG. 6, lifting off the island shaped photoresistor layer 6 from the island shaped etching stopper layer 5.

step 7, please refer to FIG. 7, deposing and implementing photolithography process and etching process to pattern a second metal layer on the island shaped etching stopper layer 5 and the gate isolation layer 3 to form the source/the drain 7.

Figure 8:
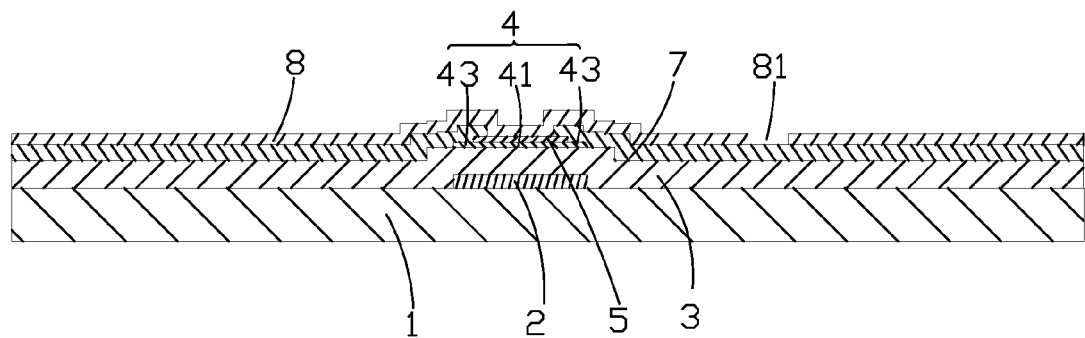
FIG. 8 is a diagram of step 8 in the manufacture method of the oxide semiconductor TFT substrate according to the present invention.

The source/the drain 7 contact the two side parts 43 of the island shaped oxide semiconductor layer 4 to establish electrical connections. Because the two side parts 43 of the island shaped oxide semiconductor layer 4 are implemented with ion implantation process and the conducting ability is enhanced. Therefore, the ohm contact resistance between the island shaped oxide semiconductor layer 4 and the source/the drain 7 is reduced. Accordingly, the driving voltage and the power consumption of the flat panel display can be effectively diminished.

step 8, please refer to FIG. 8, deposing and implementing photolithography process and etching process to pattern a protecting layer 8 on the source/the drain 7 and the etching stopper layer 5 to form a via 81 located at one side of the island shaped oxide semiconductor layer 4.

Figure 9:
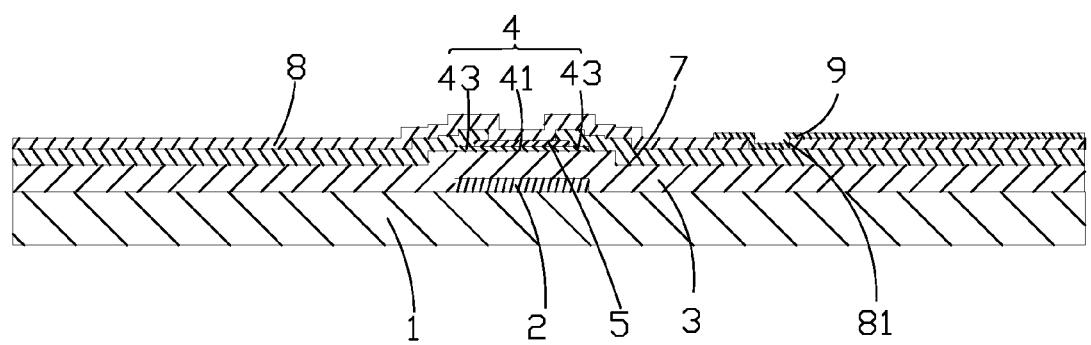
FIG. 9 is a diagram of step 9 in the manufacture method of the oxide semiconductor TFT substrate according to the present invention and a diagram of the oxide semiconductor TFT substrate structure according to the present invention.

Specifically, the material of the protecting layer 8 is silicon dioxide ($SiO_2$) or silicon oxynitride (SiON).

step 9, please refer to FIG. 9, deposing and implementing photolithography process and etching process to pattern a pixel electrode layer 9 on the protecting layer 8.

Specifically, the material of the pixel electrode layer 9 is Indium titanium oxide (ITO) or Indium zinc oxide (IZO).

The pixel electrode layer fills the via 81 and contacts the source/the drain 7 to establish electrical connections.

step 10, please refer to FIG. 10, implementing anneal process to the substrate 1 obtained in the step 9 to accomplish the manufacture of the oxide semiconductor TFT substrate.

Please refer to FIG. 9. On the basis of the aforesaid manufacture method of the oxide semiconductor TFT substrate, the present invention further provides an oxide semiconductor TFT substrate structure, comprising a substrate 1, a gate 2 on the substrate 1, a gate isolation layer 3 on the gate 2 and the substrate 1, an island shaped oxide semiconductor layer 4 directly over the gate 2 on the gate isolation layer 3, an island shaped etching stopper layer 6 on the island shaped oxide semiconductor layer 4, a source/a drain 7 on the island shaped etching stopper layer 6 and the gate isolation layer 3, a protecting layer 8 on the source/the drain 7 and the etching stopper layer 6 and a pixel electrode layer 9 on the protecting layer 8.

The island shaped oxide semiconductor layer 4 comprises a central part 41 and two side parts 43, and the two side parts are implemented with ion implantation process to enhance the conducting ability thereof; a width of the island shaped etching stopper layer 6 is smaller than a width of the island shaped oxide semiconductor layer 4 and only a central part 41 is covered; the source/the drain 7 contact the two side parts 43 to establish electrical connections. The ohm contact resistance therebetween is smaller to diminish the driving voltage and the power consumption of the flat panel display.

The protecting layer 8 comprises a pixel electrode via 81 located at one side of the island shaped oxide semiconductor layer 4, and the pixel electrode layer 9 fills the via 81 and contacts the source/the drain 7 to establish electrical connections.

Specifically, the substrate 1 is a glass substrate, and the island shaped oxide semiconductor layer 4 is an IGZO semiconductor layer, and material of the pixel electrode layer 9 is ITO or IZO and material of the protecting layer 8 is $SiO_2$ or SiON.

In conclusion, according to the manufacture method of the oxide semiconductor TFT structure of the present invention, by implementing ion implantation process to the two side parts of the island shaped oxide semiconductor layer, the conducting ability of the two side parts are raised and the two side parts contact the source/the drain, which are capable of promoting the ohm contact between the oxide semiconductor layer and the source/the drain to reduce the ohm contact resistance therebetween. The driving voltage of the flat panel display can be reduced and accordingly the power consumption of the flat panel display can be effectively diminished; according to the oxide semiconductor TFT structure of the present invention, by implementing ion implantation process to the two side parts of the island shaped oxide semiconductor layer and contacts with the source/the drain, the ohm contact resistance between the oxide semiconductor layer and the source/the drain is smaller to reduce the driving voltage of the flat panel display and to diminish the power consumption of the flat panel display.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:
1. A manufacture method of an oxide semiconductor TFT substrate, comprising steps of:
   step 1, providing a substrate, and deposing and patterning a first metal layer on the substrate to form a gate;
   step 2, deposing a gate isolation layer on the gate and the substrate;
   step 3, deposing and patterning an oxide semiconductor layer on the gate isolation layer to form an island shaped oxide semiconductor layer directly over the gate;
   step 4, sequentially deposing an etching stopper layer, a photoresistor layer on the island shaped oxide semiconductor layer and the gate isolation layer, and then implementing photolithography process to the photoresistor layer to form an island shaped photoresistor layer directly over the island shaped oxide semiconductor layer, and etching the etching stopper layer to form an island shaped etching stopper layer on the island shaped oxide semiconductor layer;
   a width of the island shaped etching stopper layer is smaller than a width of the oxide semiconductor layer; the island shaped etching stopper layer covers a central part of the island shaped oxide semiconductor layer and exposes two side parts of the island shaped oxide semiconductor layer;

step 5, implementing ion implantation process to the two side parts of the island shaped oxide semiconductor layer;

step 6, lifting off the island shaped photoresistor layer from the island shaped etching stopper layer;

step 7, deposing and patterning a second metal layer on the island shaped etching stopper layer and the gate isolation layer to form a source/a drain;

the source/the drain contact the two side parts of the island shaped oxide semiconductor layer to establish electrical connections;

step 8, deposing and patterning a protecting layer on the source/the drain and the etching stopper layer to form a via located at one side of the island shaped oxide semiconductor layer;

step 9, deposing and patterning a pixel electrode layer on the protecting layer;

the pixel electrode layer fills the via and contacts the source/the drain to establish electrical connections;

step 10, implementing anneal process to the substrate obtained in the ninth step.

2. The manufacture method of the oxide semiconductor TFT substrate according to claim 1, wherein operations of the patterning are accomplished by photolithography process and etching process.

3. The manufacture method of the oxide semiconductor TFT substrate according to claim 1, wherein the island shaped oxide semiconductor layer is an IGZO semiconductor layer.

4. The manufacture method of the oxide semiconductor TFT substrate according to claim 3, wherein the ion implantation process is implemented with hydrogen plasma.

5. The manufacture method of the oxide semiconductor TFT substrate according to claim 1, wherein material of the pixel electrode layer is ITO or IZO.

6. The manufacture method of the oxide semiconductor TFT substrate according to claim 1, wherein material of the protecting layer is $SiO_2$ or SiON.

7. The manufacture method of the oxide semiconductor TFT substrate according to claim 1, wherein the substrate is a glass substrate.

8. An oxide semiconductor TFT substrate structure, comprising a substrate, a gate on the substrate, a gate isolation layer on the gate and the substrate, an island shaped oxide semiconductor layer directly over the gate on the gate isolation layer, an island shaped etching stopper layer on the island shaped oxide semiconductor layer, a source/a drain on the island shaped etching stopper layer and the gate isolation layer, a protecting layer on the source/the drain and the etching stopper layer and a pixel electrode layer on the protecting layer; the island shaped oxide semiconductor layer comprises a central part and two side parts, and the two side parts are implemented with ion implantation process; a width of the island shaped etching stopper layer is smaller than a width of the oxide semiconductor layer and only a central part is covered; the source/the drain contact the two side parts to establish electrical connections;

the protecting layer comprises a via located at one side of the island shaped oxide semiconductor layer, and the pixel electrode layer fills the via and contacts the source/the drain to establish electrical connections.

9. The oxide semiconductor TFT substrate structure according to claim 8, wherein the island shaped oxide semiconductor layer is an IGZO semiconductor layer, and material of the protecting layer is $SiO_2$ or SiON and material of the pixel electrode layer is ITO or IZO.

10. The oxide semiconductor TFT substrate structure according to claim 8, wherein the substrate is a glass substrate.

11. An oxide semiconductor TFT substrate structure, comprising a substrate, a gate on the substrate, a gate isolation layer on the gate and the substrate, an island shaped oxide semiconductor layer directly over the gate on the gate isolation layer, an island shaped etching stopper layer on the island shaped oxide semiconductor layer, a source/a drain on the island shaped etching stopper layer and the gate isolation layer, a protecting layer on the source/the drain and the etching stopper layer and a pixel electrode layer on the protecting layer; the island shaped oxide semiconductor layer comprises a central part and two side parts, and the two side parts are implemented with ion implantation process; a width of the island shaped etching stopper layer is smaller than a width of the oxide semiconductor layer and only a central part is covered; the source/the drain contact the two side parts to establish electrical connections;

the protecting layer comprises a via located at one side of the island shaped oxide semiconductor layer, and the pixel electrode layer fills the via and contacts the source/the drain to establish electrical connections;

wherein the island shaped oxide semiconductor layer is an IGZO semiconductor layer, and material of the protecting layer is $SiO_2$ or SiON and material of the pixel electrode layer is ITO or IZO;

wherein the substrate is a glass substrate.

* * * * *